(12) United States Patent
Unton

(10) Patent No.: US 12,022,636 B2
(45) Date of Patent: Jun. 25, 2024

(54) THERMAL MANAGEMENT SYSTEM WITH IMPACT RESISTANT PACKAGING

(71) Applicant: Rolls-Royce North American Technologies Inc., Indianapolis, IN (US)

(72) Inventor: Tim Unton, Avon, IN (US)

(73) Assignee: Rolls-Royce North American Technologies Inc., Indianapolis, IN (US)

( * ) Notice: Subject to any disclaimer, the term of this patent is extended or adjusted under 35 U.S.C. 154(b) by 743 days.

(21) Appl. No.: 17/170,369

(22) Filed: Feb. 8, 2021

(65) Prior Publication Data

US 2022/0255280 A1 Aug. 11, 2022

(51) Int. Cl.
*F28D 15/00* (2006.01)
*F41H 13/00* (2006.01)
*H05K 7/20* (2006.01)

(52) U.S. Cl.
CPC ..... *H05K 7/20236* (2013.01); *F41H 13/0062* (2013.01); *H05K 7/20263* (2013.01); *H05K 7/20272* (2013.01)

(58) Field of Classification Search
CPC .......... H05K 7/20236; H05K 7/20263; H05K 7/20272; F41H 13/0062
USPC ................................................... 165/104.33
See application file for complete search history.

(56) References Cited

U.S. PATENT DOCUMENTS

| | | | |
|---|---|---|---|
| 4,413,674 A | * | 11/1983 | Avery .................... H01F 27/12 165/130 |
| 7,406,829 B2 | | 8/2008 | Coffinberry |
| 7,911,793 B2 | | 3/2011 | Attlesey |
| 7,961,475 B2 | | 6/2011 | Campbell et al. |
| 8,089,766 B2 | | 1/2012 | Attlesey |
| 8,179,677 B2 | | 5/2012 | Campbell et al. |
| 9,128,681 B2 | | 9/2015 | Attlesey |
| 9,433,132 B2 | | 8/2016 | Krishan et al. |
| 9,534,537 B2 | | 1/2017 | Gagne et al. |
| 9,692,095 B2 | | 6/2017 | Harris |
| 9,853,335 B2 | | 12/2017 | Blackwelder et al. |
| 10,123,464 B2 | | 11/2018 | Moore et al. |
| 10,143,113 B2 | | 11/2018 | Shelnutt et al. |
| 10,188,017 B2 | | 1/2019 | Gauthier et al. |
| 10,609,839 B1 | | 3/2020 | Archer et al. |
| 2008/0198883 A1 | | 8/2008 | Vetrovec |
| 2010/0118494 A1 | | 5/2010 | Campbell et al. |
| 2010/0226094 A1 | | 9/2010 | Attlesey et al. |
| 2010/0254419 A1 | | 10/2010 | Vetrovec |

(Continued)

FOREIGN PATENT DOCUMENTS

CN 210359817 * 4/2020

OTHER PUBLICATIONS

Complex Compounds: COMBAM Coordinative Molecular Bond Armor Materal, https://www.rockyresearch.com/images/TechnologiesPDF/ComplexCompoundsCOMBAM411.pdf, 2 pages.

*Primary Examiner* — Davis D Hwu
(74) *Attorney, Agent, or Firm* — Barnes & Thornburg LLP

(57) ABSTRACT

A weapons system includes a high-energy beam unit and a power and thermal management system. The high-energy beam unit is configured to discharge high-energy beams. The power and thermal management system is configured to supply power to the high-energy beam unit and to manage the temperature of the high-energy beam unit.

20 Claims, 4 Drawing Sheets

(56) References Cited

U.S. PATENT DOCUMENTS

| | | |
|---|---|---|
| 2010/0290190 A1 | 11/2010 | Chester et al. |
| 2014/0216711 A1 | 8/2014 | Shelnutt et al. |
| 2016/0128231 A1 | 5/2016 | Wagoner et al. |
| 2018/0045076 A1 | 2/2018 | Eifert |
| 2018/0058336 A1 | 3/2018 | Munevar |
| 2018/0252161 A1 | 9/2018 | Munevar |
| 2019/0082556 A1* | 3/2019 | Inano .................. H05K 7/2079 |

* cited by examiner

THERMAL MANAGEMENT SYSTEM WITH IMPACT RESISTANT PACKAGING

FIELD OF THE DISCLOSURE

The present disclosure relates generally to directed energy weapon systems, and more specifically power and thermal management systems such systems.

BACKGROUND

Directed energy systems may include power and thermal management systems. The power and thermal management systems may manage the large and intermittent electrical and thermal loads from operating the system.

Some high energy laser systems may encounter austere environments including sand, dust, rain, hail, ice, etc. and may even be exposed to other shrapnel from enemy fire. Strengthening or ruggedizing such weapons systems may be important for protecting the component from such hazardous environments.

SUMMARY

The present disclosure may comprise one or more of the following features and combinations thereof.

A weapons system may include a high-energy beam unit and a power and thermal management system. The high-energy beam unit may be configured to discharge high-energy beams. The power and thermal management system may be configured to supply power to the high-energy beam unit and to manage the temperature of the high-energy beam unit.

In some embodiments, the power and thermal management system may include a generator, power electronics, and a thermal energy storage reservoir. The generator may be configured to generate electrical energy. The power electronics may be coupled to the high-energy beam unit and the generator. The power electronics may be configured to receive electrical energy from the generator and provide the electrical energy to other components of the system. The thermal energy storage reservoir may be configured to store a cooling fluid.

In some embodiments, at least some components of the power and thermal management system may be submerged in the cooling fluid of the thermal energy storage reservoir. The components may be submerged in the cooling fluid to cool the components, to store energy, and to provide ballistics protection. In some embodiments, the at least some components of the power and thermal management system submerged in the cooling fluid may include the power electronics.

In some embodiments, the power and thermal management system may further include at least one energy store device. The at least one energy storage device may be coupled to the power electronics to store electrical energy from the generator. In some embodiments, the at least one energy store device may be located outside of the thermal energy storage reservoir.

In some embodiments, the power and thermal management system may further include a heat rejection loop. The heat rejection loop may be configured to transfer heat stored in cooling fluid of the thermal energy storage reservoir to the surrounding environment.

In some embodiments, the heat rejection loop may include a heat exchanger, a compressor, an ambient heat exchanger, and an expansion valve. The heat exchanger may be in thermal communication with the cooling fluid to transfer heat from the cooling fluid to a refrigerant of the heat rejection loop. The compressor may be fluidly coupled to the heat exchanger. The ambient heat exchanger may be in thermal communication with the surrounding environment to transfer heat from the refrigerant to the surrounding environment. In some embodiments, the at least some components of the power and thermal management system submerged in the cooling fluid may include the heat exchanger and the expansion valve.

In some embodiments, the power and thermal management system may further include a coolant loop. The coolant loop may be in thermal communication with the high-energy beam unit to transfer heat from the heat load to the cooling fluid to cool the heat load. In some embodiments, the at least some components of the power and thermal management system submerged in the cooling fluid may include the coolant loop.

In some embodiments, the power and thermal management system may further include a stirrer. The stirrer may be configured to circulate the cooling fluid in the thermal energy storage reservoir to avoid temperature dead-zones. In some embodiments, the cooling fluid may be one of water, glycol-water mixture, and a dielectric fluid.

In some embodiments, the thermal energy storage reservoir has a coating. The coating may be configured to self-seal the hole after ballistic damage.

In some embodiments, the system may further include an engine. The engine may be configured to provide power for the high-energy beam unit.

In some embodiments, the engine may be a gas turbine engine. The gas turbine engine may include a compressor, a combustor, and a turbine. The combustor may be adapted to combine air received from the compressor with fuel and to burn the fuel to supply high pressure gasses toward the turbine to rotate an output shaft of the gas turbine engine.

In some embodiments, the generator may be coupled to the gas turbine engine. The generator may be configured to generate electrical energy from the power supplied by the gas turbine engine.

According to another aspect of the present disclosure, a system may include a heat load and a power and thermal management system. The power and thermal management system may be configured to manage the temperature of the heat load.

In some embodiments, the power and thermal management system may include, power electronics, and a thermal energy storage reservoir. The generator may be configured to generate electrical energy for the system. The power electronics may be coupled to the generator. The power electronics may be configured to receive electrical energy from the generator and provide the electrical energy to other components of the system. The thermal energy storage reservoir may be configured to store a cooling fluid.

In some embodiments, at least some components of the power and thermal management system may be submerged in the cooling fluid of the thermal energy storage reservoir. The components may be submerged in the cooling fluid to cool the components, to store energy, and to provide ballistics protection. In some embodiments, the at least some components of the power and thermal management system submerged in the cooling fluid may include the power electronics.

In some embodiments, the power and thermal management system may further include at least one energy store device. The at least one energy storage device may be coupled to the power electronics to store electrical energy from the generator. In some embodiments, the at least one energy store device may be located outside of the thermal energy storage reservoir.

In some embodiments, the power and thermal management system may further include a heat rejection loop. The heat rejection loop may be configured to transfer heat stored in cooling fluid of the thermal energy storage reservoir to the surrounding environment. In some embodiments, the at least some components of the power and thermal management system submerged in the cooling fluid may include components of the heat rejection loop.

In some embodiments, the power and thermal management system may further include a coolant loop. The coolant loop may be in thermal communication with the high-energy beam unit to transfer heat from the heat load to the cooling fluid to cool the heat load.

In some embodiments, the at least some components of the power and thermal management system submerged in the cooling fluid may include the coolant loop. In some embodiments, the cooling fluid may be one of water, glycol-water mixture, and a dielectric fluid.

In some embodiments, the thermal energy storage reservoir may have a coating. The coating may be configured to self-seal the hole after ballistic damage.

In some embodiments, the system may further include an engine. The engine may be configured to provide power for the high-energy beam unit.

In some embodiments, the engine may be a gas turbine engine. The gas turbine engine may include a compressor, a combustor, and a turbine. The combustor may be adapted to combine air received from the compressor with fuel and to burn the fuel to supply high pressure gasses toward the turbine to rotate an output shaft of the gas turbine engine.

In some embodiments, the generator may be coupled to the gas turbine engine. The generator may be configured to generate electrical energy from the power supplied by the gas turbine engine.

According to another aspect of the present disclosure, a weapons system may include a high-energy beam unit, a gas turbine engine, and a power and thermal management system. The high-energy beam unit may be configured to discharge high-energy beams. The gas turbine engine may be configured to provide power for the high-energy beam unit. The power and thermal management system may be configured to supply power provided by the gas turbine engine to the high-energy beam unit and to manage the temperature of the high-energy beam unit.

In some embodiments, the gas turbine engine may include a compressor, a combustor, and a turbine. The combustor may be adapted to combine air received from the compressor with fuel and to burn the fuel to supply high pressure gasses toward the turbine to rotate an output shaft of the gas turbine engine.

In some embodiments, the power and thermal management system may include a generator, power electronics, and a thermal energy storage reservoir. The generator may be coupled to the gas turbine engine and configured to generate electrical energy. The power electronics may be coupled to the generator. The generator may be configured to receive electrical energy from the generator and provide the electrical energy to other components of the system. The thermal energy storage reservoir may be configured to store a cooling fluid.

In some embodiments, at least some components of the power and thermal management system may be submerged in the cooling fluid of the thermal energy storage reservoir. The components may be submerged to cool the components and to provide ballistics protection.

These and other features of the present disclosure will become more apparent from the following description of the illustrative embodiments.

DETAILED DESCRIPTION OF THE DRAWINGS

Figure 1:
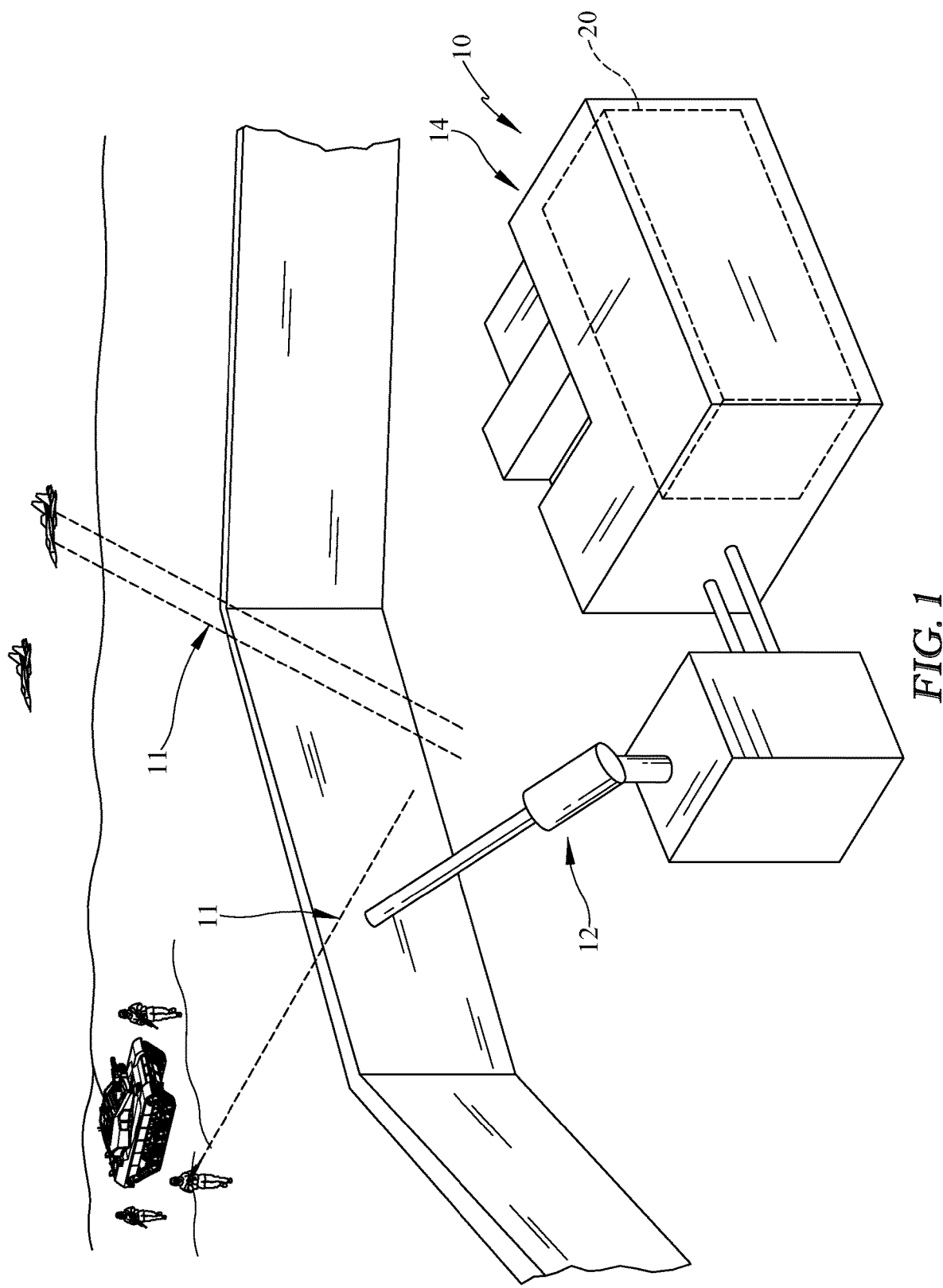
FIG. 1 is perspective view of a weapons system including a high-energy beam unit configured to discharge high-energy beams and a power and thermal management system configured to manage the power provided to the high energy beam unit and the thermal load of the system, and further showing the power and thermal management system includes a thermal energy storage reservoir that submerges other components of the power and thermal management system in a cooling fluid to cool the components and to provide ballistics protection.

For the purposes of promoting an understanding of the principles of the disclosure, reference will now be made to a number of illustrative embodiments illustrated in the drawings and specific language will be used to describe the same.

Figure 2:
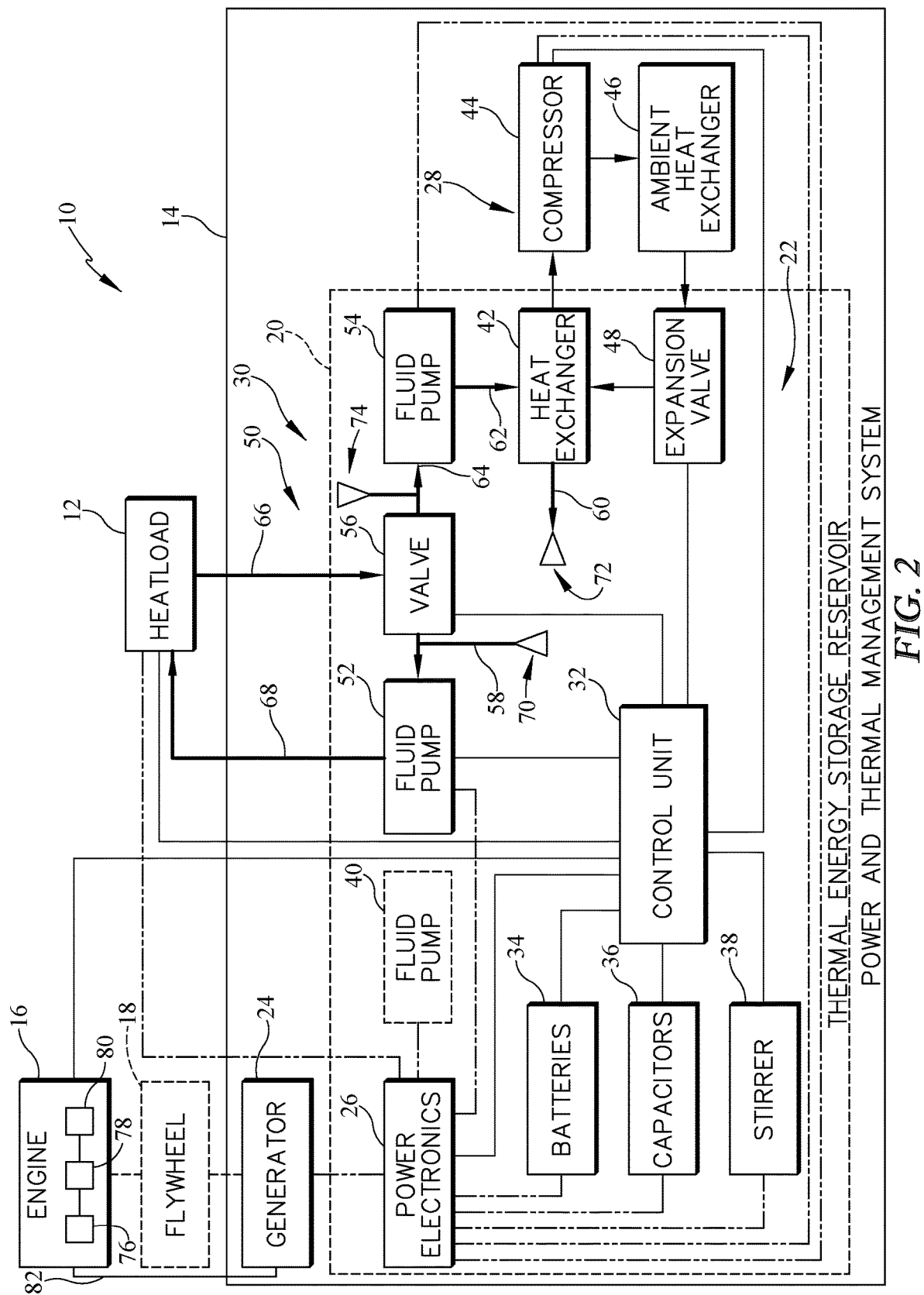
FIG. 2 is a diagrammatic view of the system of FIG. 1 showing the power and thermal management system further includes a generator configured to generate electrical energy, power electronics configured to receive electrical energy from the generator and provide the electrical energy to other components of the system, a heat rejection loop configured to transfer heat from the cooling fluid to the surrounding environment, a coolant loop in thermal communication with the high-energy beam unit to cool the heat load of the unit, and a control unit connected to the other components of the system, and showing the power electronics, the heat rejection loop, the coolant loop, and the control unit are all submerged in the thermal energy storage reservoir.

A weapons system adapted for combat is shown in FIG. 1. The weapons system 10 includes a high-energy heat load 12, such as a high-energy beam unit 12 and a power and thermal management system 14 as shown in FIGS. 1 and 2. The power and thermal management system 14 is configured to manage the power provided to the high-energy beam unit 12 while also managing the temperature of the heat load produced by the high-energy beam unit 12 and other components of the system 10.

Power and thermal management systems for weapons systems 10 having high-energy lasers may have to manage large and intermittent electrical and thermal loads, while also withstanding austere environments. Such weapons systems 10 may be exposed to sand, dust, rain, hail, ice, etc.

These weapon systems 10 may also be exposed to enemy fire 11 including bullets, shrapnel, or other debris as suggested in FIG. 1.

The power and thermal management system 14 of the present disclosure therefore includes a thermal energy storage reservoir 20 as shown in FIGS. 1 and 2. The thermal energy storage reservoir 20 is configured to store a cooling fluid 22 for cooling the other components of the power and thermal management system 14 and/or the heat load 12. Additionally, to help protect the power and thermal management system 14 against harsh environments and/or enemy fire 11, at least some of the components of the power and thermal management system 14 are submerged in the cooling fluid 22.

By submerging at least some of the components in the thermal energy storage reservoir 20, the overall size and space allocated to the power and thermal management system 14 may be minimized. Further, enclosing the components in the thermal energy storage reservoir 20 also seals the components from sand, dust, rain, hail, ice, etc. and the cooling fluid 22 provides ballistic protection. Bullets and other shrapnel may be slowed by the cooling fluid 22, preventing the components of the system 14 from being severely damaged.

Then, in the event the thermal energy storage reservoir 20 is struck, any leaks or damage may be repaired and the reservoir 20 refilled with the cooling fluid 22. In some embodiments, the thermal energy storage reservoir 20 may have a ballistics protection coating on the outer surface of the reservoir 20. The coating is configured to self-seal the hole after ballistic damage.

In the illustrative embodiment, the cooling fluid 22 is water. In some embodiments, the cooling fluid 22 may be glycol-water mixture. In other embodiments, the cooling fluid 22 may be a dielectric fluid such as FC-72 or HFE7100. In other embodiments, the cooling fluid 22 may be another suitable coolant or fluid to cool the components of the system 10 while also providing ballistic protection.

The power and thermal management system 14 further includes a generator 24, power electronics 26, a heat rejection loop 28, a coolant loop 30, and a control unit 32 as shown in FIG. 2. The generator 24 is configured to generate electrical energy and supply the electrical energy to the power electronics 26 coupled to the generator 24. The power electronics 26 are configured to receive electrical energy from the generator 24 and provide the electrical energy to other components of the system 14. The heat rejection loop 28 is in thermal communication with the cooling fluid 22 in the thermal energy storage reservoir 20 to transfer heat from the cooling fluid 22 to the surrounding environment. The coolant loop 30 has a fluid conduit system 50 in thermal communication with the heat load 12 and pumps 52, 54 configured to move fluid through the fluid conduit system 50 to transfer heat from the heat load 12 to the cooling fluid 22 to cool the heat load 12. The control unit 32 is coupled to the components of the system 10 to control the supply of power, the flow of the cooling fluid 22, and other aspects of the system 10.

In the illustrative embodiment, the power electronics 26, at least a portion of the heat rejection loop 28, the coolant loop 30, and the control unit 32 are submerged in the cooling fluid 22 in the thermal energy storage reservoir 20. In other embodiments, some components may be located outside of the thermal energy storage reservoir 20.

The heat rejection loop 28 is a two-phase coolant loop that includes a heat exchanger 42, a compressor 44, an ambient heat exchanger 46, and an expansion valve 48 as shown in FIG. 2. The heat exchanger 42 is in thermal communication with the cooling fluid 22 of the thermal energy storage reservoir 20 to transfer heat from the cooling fluid 22 to a refrigerant flowing through the heat rejection loop 28. The compressor 44 is fluidly coupled to the heat exchanger 42 to compress the vaporized refrigerant to the pressure in the heat rejection loop 28, in order for refrigerant to be cooled by the ambient heat exchanger 46 fluidly coupled to the compressor 44. The ambient heat exchanger 46 is in thermal communication with the surrounding environment to transfer heat from the refrigerant to the surrounding environment. The expansion valve 48 is in fluid communication with the ambient heat exchanger 46 to receive the cooled refrigerant and removes pressure from the refrigerant before the cooled refrigerant enters the heat exchanger 42.

In the illustrative embodiment, the heat exchanger 42 and the expansion valve 48 are submerged in the thermal energy storage reservoir 20 as shown in FIG. 2. The compressor 44 and the ambient heat exchanger 46 are located outside of the thermal energy storage reservoir 20 so as not to provide added heat to the cooling fluid 22 in the reservoir 20.

The coolant loop 30 includes the fluid conduit system 50, a first pump 52, a second pump 54, and a valve 56 as shown in FIG. 2. The fluid conduit system 50 has a plurality of fluid conduits 58, 60, 62, 64, 66, 68 to move cooling fluid 22 between the different components 52, 54, 56 in the coolant loop 30 and the heat load 12. The first pump 52 is configured to move a first flow of cooling fluid 22 through the coolant loop 30. The second pump 54 is configured to move a second flow of cooling fluid 22 through the heat exchanger 42 to cool the cooling fluid 22. The valve 56 is configured to vary the flow rates of the first and second flows of cooling fluid 22 from different conduits 58, 64 to provide a mixed stream of cooling fluid 22 with a predetermined target temperature to cool the heat load 12.

In the illustrative embodiment, the fluid conduit system 50, the pumps 52, 54, and the valve 56 are submerged in the cooling fluid 22 and encased in the thermal energy storage reservoir 20. The inlet and outlet conduits 66, 68 of the system 50 may extend out of the thermal energy storage reservoir 20 to the heat load 12.

The fluid conduit system 50 includes a first conduit 58, a second conduit 60, a third conduit 62, a fourth conduit 64, and inlet/outlet conduits 66, 68 as shown in FIG. 2. The first conduit 58 is in fluid communication between the thermal energy storage reservoir 20 and the valve 56 to provide a first flow of cooling fluid 22 with a first temperature. The second conduit 60 is in fluid communication between the thermal energy storage reservoir 20 and the heat exchanger 42. The third conduit 62 is in fluid communication between the heat exchanger 42 and the second pump 54. The fourth conduit 64 is in fluid communication between the second pump 54 and the valve 56. The outlet conduit 66 in fluid communication between the valve 56 and the heat load 12, while the inlet conduit 68 is in fluid communication between the heat load 12 and the first pump 52.

In the illustrative embodiment, the valve 56 receives the flow of cooling fluid 22 from the heat load 12 and is configured to vary the flow of cooling fluid 22 to each fluid pump 52, 54. The valve 56 varies a first flow rate of cooling fluid 22 to the first pump 52 through the first conduit 58 and a second flow rate of cooling fluid 22 to the second pump 54 through the fourth conduit 64 based on the temperature of the cooling fluid 22 in the inlet conduit 68.

The valve 56 is configured to vary the flows of cooling fluid 22 to each fluid pump 52, 54 so as to maintain the temperature of the cooling fluid 22 in the inlet conduit 68 at a target temperature. In cases where the temperature of the cooling fluid 22 in the inlet conduit 68 is above the target temperature, the valve 56 is configured to increase the flow of cooling fluid 22 to the second pump 54 and decrease the flow of cooling fluid 22 to the first pump 52. The decrease in the flow of cooling fluid 22 to the first pump 52 would otherwise cause an insufficient flow rate to the heat load 12. To maintain the flow of cooling fluid 22 to the first pump 52, cooling fluid 22 from the reservoir 20 is drawn in through the first port 70.

Conversely, in cases where the temperature of the cooling fluid 22 is the inlet conduit 68 is below the target temperature, the valve 56 is configured to increase the flow of cooling fluid 22 to the first pump 52 and decrease the flow of cooling fluid 22 to the second pump 54. The decrease of the flow of cooling fluid 22 to the first pump 52 would otherwise cause an insufficient flow rate to the heat exchanger 42. To maintain the flow of cooling fluid 22 to the second pump 54, cooling fluid 22 from the reservoir 20 is drawn in through the third port 74.

During operation, the first pump 52 is directed to provide a flow of cooling fluid 22 to the heat load 12 at a constant flow rate. The flow of cooling fluid cools the heat load 12 by transferring heat from the heat load 12 to the cooling fluid 22. The cooling fluid 22 exits through the outlet conduit 66 to the valve 56.

Simultaneously, the second pump 54 is directed to provide a flow of cooling fluid 22 to the heat exchanger 42. In some instances, such as start up, cooling fluid 22 from the reservoir 20 may be drawn into the second pump 54 through the third port 74 and pumped to the heat exchanger 42 by the second pump 54 as valve 56 directs a majority of the flow to the first pump 52. The temperature of the cooling fluid 22 in the inlet conduit 68 may be cooler at start up, so as the first pump 52 provides fluid to the heat load 12, the cooling fluid 22 returning to the valve 56 has an increased temperature than the cooling fluid 22 in the reservoir 20. To help increase the temperature of the cooling fluid 22 in the inlet conduit 68, the valve 56 directs most if not all the cooling fluid 22 from the outlet conduit 66 to the first pump 52.

As the temperature of the cooling fluid 22 in the inlet conduit 68 approaches or reaches the target temperature, the temperature of the cooling fluid 22 returning to the valve 56 may be at or above the target temperature for the cooling fluid 22 in the inlet conduit 68. The valve 56 is then configured to direct more cooling fluid 22 to the second pump 54, which causes more cooling fluid 22 from the cooling reservoir 20 to be drawn in through the first port 70 to the first pump 52. The cooling fluid 22 from the reservoir 20 mixes with the cooling fluid 22 from the valve 56 in the first pump 52 so that the temperature of the cooling fluid 22 discharged by the first pump 52 to the heat load 12 is at that target temperature.

In high heat load conditions, the temperature of the cooling fluid 22 returning to the valve 56 relatively too high. Thus, the valve 56 directs most if not all of the cooling fluid 22 to the second pump 54. In such instances, the valve 56 may provide more flow to second pump 54 than the second pump 54 can accept. Some of the cooling fluid 22 may be exhausted back the reservoir 20 through the third port 74.

The heat exchanger 42 cools the cooling fluid 22 provided by the second pump 54 before it is exhausted back into the thermal energy storage reservoir 20 through the second port 72. The cooled cooling fluid 22 helps reduce the bulk temperature of the cooling fluid 22 in the thermal energy storage reservoir 20. As the heat load 12 and other components submerged in the cooling fluid 22 of the reservoir 20 transfer heat to the cooling fluid 22, the cooling fluid 22 may reach a predetermined temperature limit in which the cooling fluid 22 is not sufficiently cooling the other components. By exhausting the cooled cooling fluid 22, back to the thermal energy storage reservoir 20, the cooled cooling fluid 22 helps to reduce the bulk temperature of the cooling fluid 22 in the reservoir 20.

The control unit 32 is coupled to the heat load 12, or the high-energy beam unit 12 so to be in communication with a controller of the heat load 12. In other embodiments, the control unit 32 may be configured to act as the control unit 32 of the system 14 and the high-energy beam unit 12. In other embodiments, the control unit 32 may not be in communication with the high-energy beam unit 12. The control unit 32 is also coupled to the power electronics 26 to direct the power electronics 26 to supply power to different components of the system 10 in the illustrative embodiment.

The control unit 32 is also coupled to components of the heat rejection loop 28 as shown in FIG. 2. The control unit 32 is coupled to the compressor 44 and the expansion valve 48 to control the cooling of the cooling fluid 22. For instance, the control unit 32 is configured to direct the heat rejection loop 28 to cool the cooling fluid 22 to a temperature based on the bulk temperature of the cooling fluid 22 in the thermal energy storage reservoir 20.

In some embodiments, the control unit 32 is configured to direct the heat rejection loop 28 to increase cooling of the cooling fluid 22 if the temperature in the thermal energy storage reservoir 20 is above a predetermined temperature limit. In other embodiments, the control unit 32 is configured to direct the heat rejection loop 28 to increase/decrease cooling of the cooling fluid 22 if the temperature in the thermal energy storage reservoir 20 is outside of a predetermined temperature threshold. The temperature threshold may include the predetermined temperature limit and the minimum temperature needed for efficiency of the components.

The control unit 32 is also coupled to components of the coolant loop 30 as shown in FIG. 2. The control unit 32 is coupled to the pumps 52, 54 to control the flow of cooling fluid 22 through the fluid conduit system 50. The control unit 32 is also coupled to the valve 56 to control the different flow rates varied by the valve 56.

The control unit 32 is configured to direct the valve 56 to vary the first and second flow rates of the cooling fluid 22 to each of the pumps 52, 54. The control unit 32 controls the valve 56 based on the temperature of the cooling fluid 22 in the inlet conduit 68. In some embodiments, the control unit 32 may include sensors to measure the temperature of the cooling fluid 22 at the outlet of the first pump 52 or in the inlet conduit 68.

If the control unit 32 determines the temperature of the cooling fluid 22 in the inlet conduit 68 is below a target supply temperature, the control unit 32 directs the valve 56 to increase the first flow rate to the first pump 52, while simultaneously decreasing the second flow rate to the second pump 54. In response, the pump 54 draws in more cooling fluid 22 through the third port 74 to maintain the flow rate to the heat exchanger 42.

In some instances, the control unit 32 may direct the valve 56 to divert all of the cooling fluid 22 from the outlet conduit 66 to the first pump 52 if the temperature of the cooling fluid 22 in the inlet conduit 68 is below a target supply temperature. In other cases, the control unit 32 may direct the valve 56 to supply more of the cooling fluid 22 from the outlet conduit 66 to the first pump 52 than the second pump 54, if the temperature of the cooling fluid 22 in the inlet conduit 68 is below a target supply temperature.

If the control unit 32 determines the temperature of the cooling fluid 22 is above a target supply temperature, the control unit 32 directs the valve 56 to decrease the first flow rate to the first pump 52, while simultaneously increasing the second flow rate to the second pump 54. In response, the pump 52 draws in more cooling fluid 22 through the first port 70 to maintain the flow rate to the heat load 12. In some embodiments, if the second flow rate is higher than an allowable flow rate for the pump 54, the port 74 exhausts at least a portion of the flow to the reservoir 20.

In some instances, the control unit 32 may direct the valve 56 to supply more of the cooling fluid 22 from the outlet conduit 66 to the second pump 54 than the first pump 52, if the temperature of the cooling fluid 22 in the inlet conduit 68 is above a target supply temperature. In other instances, the control unit 32 may direct the valve 56 to divert all of the cooling fluid 22 from the outlet conduit 66 to the second pump 54, if the temperature of the cooling fluid 22 in the inlet conduit 68 is above a target supply temperature.

In the illustrative embodiments, the target supply temperature may be a set temperature threshold. In other embodiments, the target supply temperature may be set temperature. In some embodiments, the control unit 32 may direct the valve 56 to appropriately vary the first and second flow rates to each pump 52, 54 based on the trend of the temperature in the inlet conduit 68.

In other embodiments, the control unit 32 may also measure the temperature of the cooling fluid 22 in the outlet conduit 66. The control unit 32 may direct the valve 56 to vary the first and second flow rates of the cooling fluid 22 to each of the pumps 52, 54 based the temperature of the cooling fluid 22 in the outlet conduit 66. In other embodiments, the control unit 32 may direct the valve 56 to vary the first and second flow rates of the cooling fluid 22 to each of the pumps 52, 54 based on bulk temperature of the reservoir 20.

In some embodiments, the control unit 32 may control the flow rate of the first pump 52 to the heat load 12 based on the use of the high-energy beam unit 12. If the control unit 32 detects that the high-energy beam unit 12 is to be fired, the control unit 32 may increase the flow rate of cooling fluid 22 to the heat load 12 in anticipation of a high heat load, as a result of using the high-energy beam unit 12. In other instances, for example if the high-energy beam unit 12 is not in use, the control unit 32 detects that the high-energy beam unit 12 is not in use or at rest and therefore directs the first pump 52 to reduce the flow rate of cooling fluid 22 to the heat load 12.

In the illustrative embodiment, the power and thermal management system 14 further includes at least one energy storage device 34, 36 as shown in FIG. 2. The energy storage device 34, 36 is coupled to the power electronics 26 and is configured to be used for storing power and/or providing power to other components of the system 10.

Figure 3:
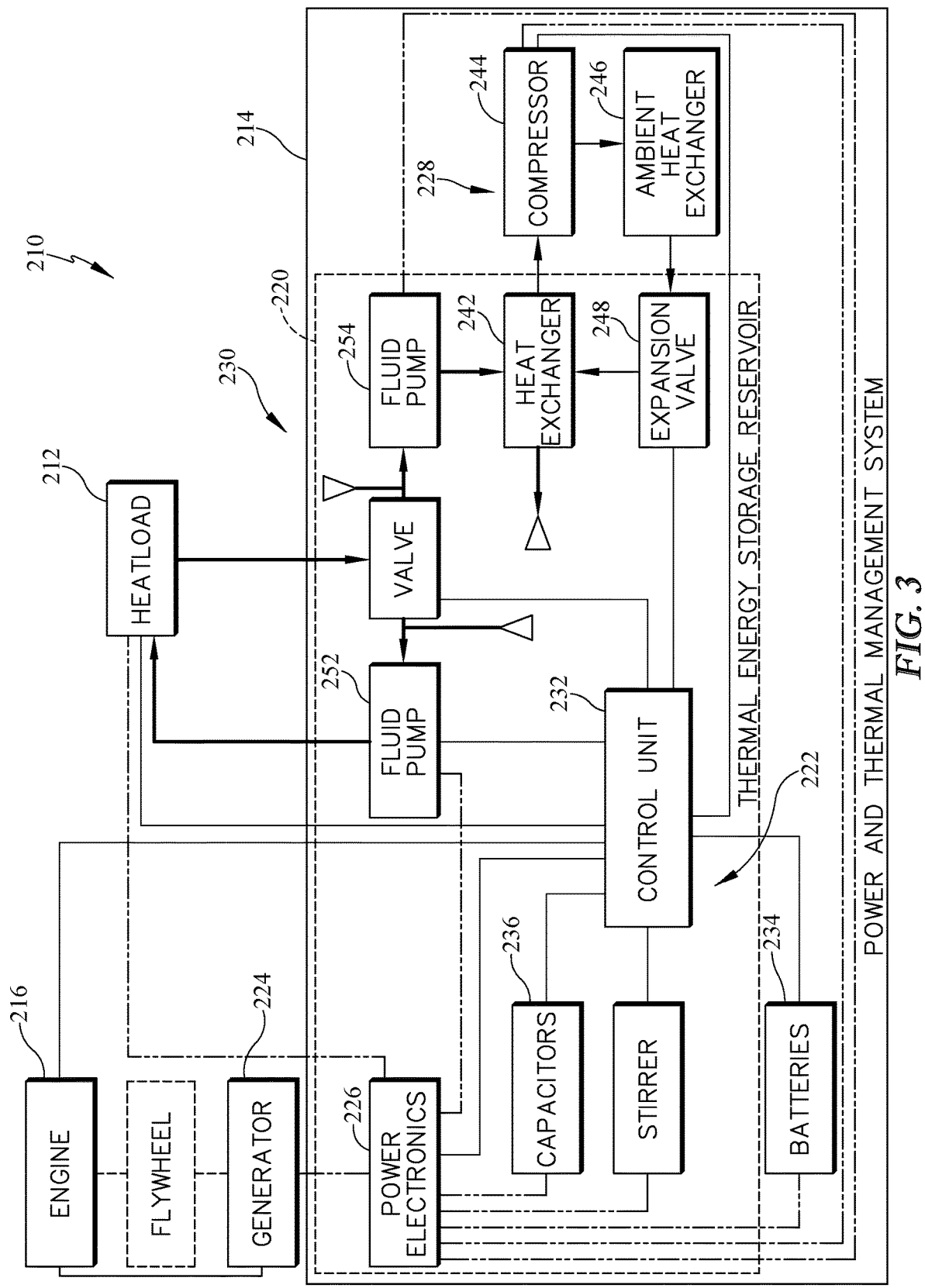
FIG. 3 is a diagrammatic view of another embodiment of a power and thermal management system adapted for use with the weapons system of FIG. 1 showing some of the components of the power and thermal management system may be located outside of the thermal energy storage reservoir.

The energy storage device 34, 36 includes batteries 34 and capacitors 36 in the illustrative embodiment. The batteries 34 are submerged in the cooling fluid 22 in the thermal energy storage reservoir 20 in the illustrative embodiment of FIG. 2. In another embodiment, the batteries 234 may be located outside of the thermal energy storage reservoir 220 as shown in FIG. 3.

The capacitors 36 are coupled to the power electronics 26 to store electrical power provided by the generator 24. The capacitors 36 are submerged in the cooling fluid 22 in the thermal energy storage reservoir 20 in the illustrative embodiment of FIG. 2.

In the illustrative embodiment, the power and thermal management system 14 further includes a stirrer 38 as shown in FIG. 2. The stirrer 38 is coupled to the power electronics 26 and is configured to mix the cooling fluid 22 in the thermal energy storage reservoir 20. Mixing or constant movement of the cooling fluid 22 may be important to avoid dead zones. The stirrer 38 helps move and mix the cooling fluid 22.

In other embodiments, the ports 70, 72, 74 may be arranged to provide flow distribution that encourages mixing of the cooling fluid 22 in the thermal energy storage reservoir 20. The ports 70, 72, 74 intake/exhaust cooling fluid in the coolant loop 30 to and from the thermal energy storage reservoir 20 thereby mixing the cooling fluid 22 at different locations in the reservoir 20 as suggested in FIG. 2.

In some embodiments, the power and thermal management system 14 may further includes a pump 40 as shown in FIG. 2. The pump 40 may be coupled to the power electronics 26 and configured to provide cooling fluid 22 to other components in the system 14. The pump 40 may provide cooling fluid 22 to other components that are either (i) not contained within the thermal energy storage reservoir 20 or (ii) require a different temperature/flowrate/pressure than that of the heat load 12.

Turning again to the system 10, the system 10 may further include an engine 16 as shown in FIG. 2. The engine 16 is configured to provide power for the high-energy beam unit 12.

In the illustrative embodiment, the engine 16 is a gas turbine engine 16 which may include a compressor 76, a combustor 78, and a turbine 80 as shown in FIG. 2. The combustor 78 is adapted to combine air received from the compressor 76 with fuel. The combustor 78 burns the fuel to supply high pressure gasses toward the turbine 80 to rotate an output shaft 82 of the gas turbine engine 16. In other embodiments, the engine 16 may be another suitable internal combustion engine.

In the illustrative embodiment, the power and thermal management system 14 is configured to supply power provided by the gas turbine engine 16 to the high-energy beam unit 12. The generator 24 is coupled to the output shaft 82 of the gas turbine engine 16 to generate electrical energy from the power provided by the gas turbine engine 16. The power electronics 26 are coupled to the generator 24 to receive the electrical energy from the generator 24 and provide the electrical energy to other components of the system 10.

In the illustrative embodiment, the system 10 may further include a flywheel 18 as suggested in FIG. 2. The flywheel 18 may be coupled between the gas turbine engine 16 and the generator 24. The flywheel 18 is configured to store rotational energy, which may be converted to electrical energy by the generator 24.

The control unit 32 is configured to control the flow of power/electrical energy between the different components 12, 16, 24, 34, 36 in the system 10. The control unit 32 is configured to direct the power electronics 26 to supply power to the high-energy beam unit 12 when the control unit 32 directs the high-energy beam unit 12 to discharge the high-energy beams. The control unit 32 is configured to direct the power electronics 26 to provide electrical energy from one of the generator 24, the batteries 34, and the capacitors 36 to the high-energy beam unit 12 for the high-energy beams.

The control unit 32 may be configured to direct the power electronics 26 to provide electrical energy generated by the generator 24 to the high-energy beam unit 12 based on the electrical energy reserves in the batteries 34 and/or the capacitors 36. The control unit 32 may be configured to direct the power electronics 26 to provide electrical energy from one of the batteries 34 and the capacitors 36 to the high-energy beam unit 12 based on the power output from the gas turbine engine 16.

The control unit 32 may also be configured to direct the power electronics 26 to provide electrical energy from the batteries 34, while also transferring electrical energy generated by the generator 24 to the capacitors 36 to store the electrical energy. The control unit 32 is also configured to direct the power electronics 26 to provide electrical energy generated by the generator 24 to the batteries 34 and/or the capacitors 36 for storage in the event the high-energy beam unit 12 is not being used.

In the illustrative embodiment, the control unit 32 is submerged in the cooling fluid 22 of the thermal energy storage reservoir 20. In other embodiments, the control unit 32 may be located outside of the thermal energy storage reservoir 20.

Another embodiment of a power and thermal management system 214 in accordance with the present disclosure is shown in FIG. 3. The power and thermal management system 214 is substantially similar to the power and thermal management system 14 shown in FIGS. 1 and 2 and described herein. Accordingly, similar reference numbers in the 200 series indicate features that are common between the power and thermal management system 214 and the power and thermal management system 14. The description of the power and thermal management system 14 is incorporated by reference to apply to the power and thermal management system 214, except in instances when it conflicts with the specific description and the drawings of the power and thermal management system 214.

The power and thermal management system 214 includes a thermal energy storage reservoir 220, power electronics 226, a heat rejection loop 228, a coolant loop 230, and a control unit 232 as shown in FIG. 3. The thermal energy storage reservoir 220 is configured to store a cooling fluid 222 for cooling the other components of the power and thermal management system 214 and/or a heat load 12.

In the illustrative embodiment of FIG. 3, the power electronics 226 are configured to receive electrical energy from an outside power source. The engine 216 and the generator 224 are included in the system 10, but are not a part of the power and thermal management system 214. The power and thermal management system 214 may be connected to any outside power source.

The heat rejection loop 228 is in thermal communication with the cooling fluid 222 in the thermal energy storage reservoir 220 to transfer heat from the cooling fluid 222 to the surrounding environment. The coolant loop 230 has a fluid conduit system 250 and pumps 252, 254 configured to move fluid through the fluid conduit system 250 to transfer heat from the heat load 212 to the cooling fluid 222 to cool the heat load 212. The control unit 232 is coupled to the components of the system 210 to control the supply of power, the flow of cooling fluid, and other aspects of the system 210.

Additionally, to protect the power and thermal management system 214 against harsh environments and/or enemy fire 11, at least some of the components of the power and thermal management system 214 are submerged in the cooling fluid 222. In the illustrative embodiment, the power electronics 226, a heat exchanger 242 and expansion valve 248 included in the heat rejection loop 228, the coolant loop 230, and the control unit 232 are submerged in the cooling fluid 222.

Some components of the power and thermal management system 214 may be located outside of the thermal energy storage reservoir 220. As discussed above, the generator 224, the compressor 244, and the ambient heat exchanger 246 of the heat rejection loop 228 are located outside of the thermal energy storage reservoir 220.

Additionally, the batteries 234 are located outside of the thermal energy storage reservoir 220 as shown in FIG. 3. The performance of the batteries 234 may be dependent on the temperature of the batteries 234 and thus the temperature of the cooling fluid 222 in the thermal energy storage reservoir 220. If the batteries 234 are too cold, the performance may be degraded.

Figure 4:
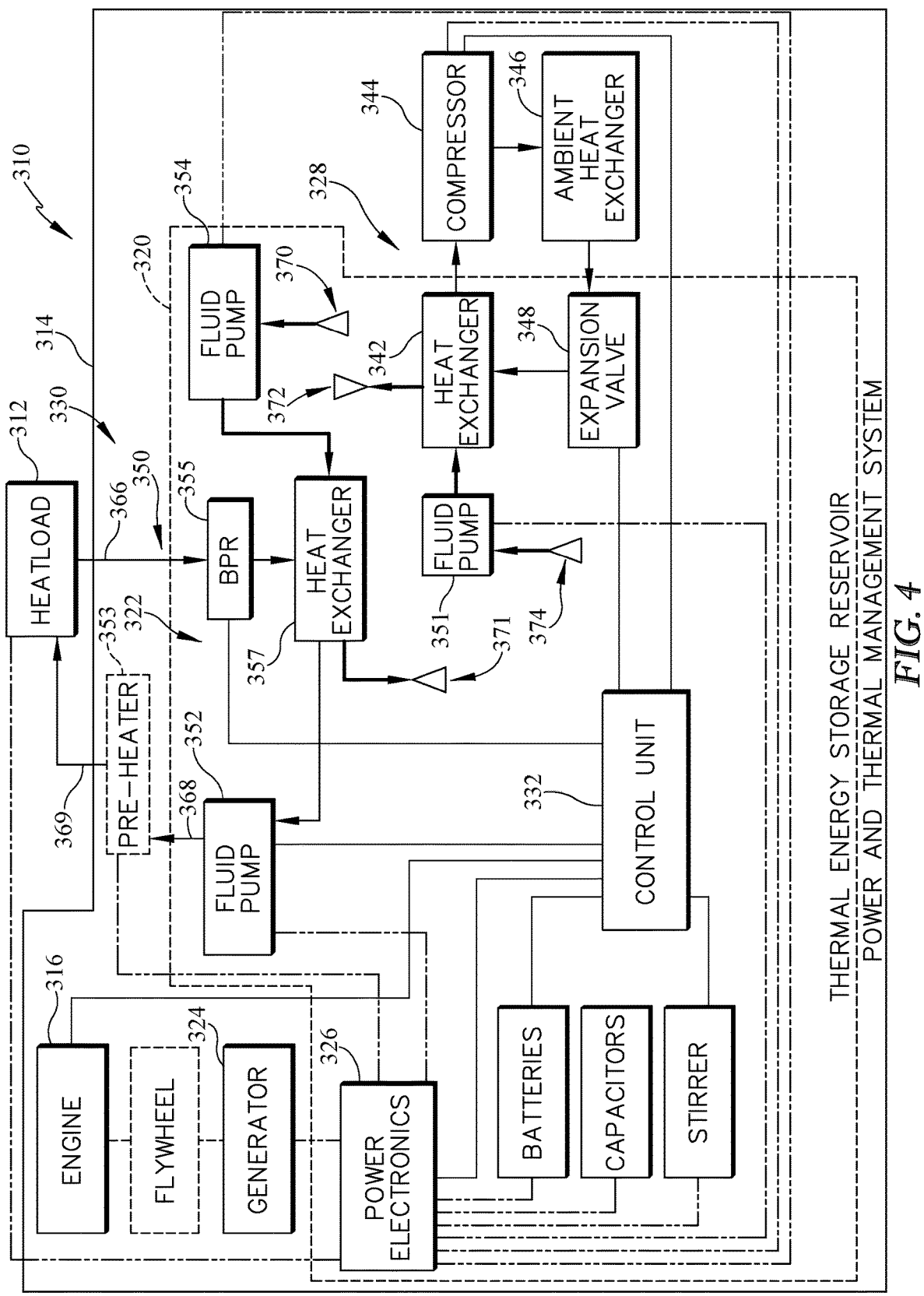
FIG. 4 is a diagrammatic view of another embodiment of a power and thermal management system adapted for use with the weapons system of FIG. 1 showing some of the power and thermal management system includes a coolant loop in thermal communication with the high-energy beam unit to cool the heat load of the unit and a heat rejection loop to transfer heat from the cooling fluid to the surrounding environment that is decoupled from the coolant loop.

Another embodiment of a power and thermal management system 314 in accordance with the present disclosure is shown in FIG. 4. The power and thermal management system 314 is substantially similar to the power and thermal management system 14 shown in FIGS. 1 and 2 and described herein. Accordingly, similar reference numbers in the 300 series indicate features that are common between the power and thermal management system 314 and the power and thermal management system 14. The description of the power and thermal management system 14 is incorporated by reference to apply to the power and thermal management system 314, except in instances when it conflicts with the specific description and the drawings of the power and thermal management system 314.

The power and thermal management system 314 includes an engine 316, a thermal energy storage reservoir 320, a generator 324, power electronics 326, a heat rejection loop 328, a coolant loop 330, and a control unit 332 as shown in FIG. 4. The thermal energy storage reservoir 320 is configured to store a cooling fluid 322 for cooling the other components of the power and thermal management system 314 and/or a heat load 12. To protect the power and thermal management system 314 against harsh environments and/or enemy fire 11, at least some of the components of the power and thermal management system 314 are submerged in the cooling fluid 322.

In the illustrative embodiment, the engine 316 and the generator 324 are included in the power and thermal management system 314 to generate and provide power for the power electronics 326. The generator 324 is configured to generate electrical energy from the work produced by the engine 3316 and supply the electrical energy to the power electronics 326 coupled to the generator 324. The power electronics 326 are configured to receive electrical energy from the generator 324 and provide the electrical energy to other components of the system 314.

The heat rejection loop 328 is in thermal communication with the cooling fluid 322 in the thermal energy storage reservoir 320 to transfer heat from the cooling fluid 322 to the surrounding environment. The coolant loop 330 has a fluid conduit system 350 and pumps 352, 354 configured to move fluid through the fluid conduit system 350 to transfer heat from the heat load 312 to the cooling fluid 322 to cool the heat load 312. The control unit 332 is coupled to the components of the system 310 to control the supply of power, the flow of cooling fluid, and other aspects of the system 310.

In the illustrative embodiment, the heat rejection loop 328 is decoupled from the coolant loop 330 as shown in FIG. 4. The coolant loop 330 is a closed loop that is separate from the heat rejection loop 328.

The heat rejection loop 328 includes a separate fluid pump 351 as shown in FIG. 4. The pump 351 moves a flow of cooling fluid 322 from the reservoir 320 through a heat exchanger 342 to transfer the heat of the cooling fluid 322 to the refrigerant in the heat rejection loop 328. The compressor 344, the ambient heat exchanger 346, and the expansion valve 348 complete the two-phase coolant loop to transfer heated refrigerant to the surrounding environment.

In the illustrative embodiment, the pump 351 draws cooling fluid 322 from the reservoir 320 in through a port 374 and provides a flow of cooling fluid 322 to the heat exchanger 342. The cooling fluid 322 moves through the heat exchanger 342, which transfers the heat from the cooling fluid 22 to the refrigerant in the loop 328. The cooling fluid 322 is therefore cooled before it is exhausted back into the reservoir 320 through the port 372.

The coolant loop 330 may be a single-phase coolant loop or a two-phase coolant loop. The coolant or refrigerant in the coolant loop 330 may be the same as the cooling fluid 22 in the reservoir 20. In some embodiments, the coolant in the coolant loop 330 may be different from the cooling fluid 22 in the reservoir 20.

In the illustrative embodiment, the coolant loop 330 further includes a back pressure regulator 355 and a heat exchanger 357 as shown in FIG. 4. The fluid pump 352 pumps refrigerant to the heat load 312 to cool the heat load 312 through the inlet conduit 368. The refrigerant then flows from the heat load 312 through the outlet conduit 366 to the back pressure regulator (BPR) 355, which is configured to control the pressure in the outlet conduit 366. If the pressure in the outlet conduit 366 is above/below the desired pressure, the BPR 355 opens/closes to control the pressure in the outlet conduit 366. The refrigerant then flows through the heat exchanger 357 that is in thermal communication with the cooling fluid 322 of the reservoir 320.

In the illustrative embodiment, the pump 354 draws in cooling fluid 322 form the reservoir 320 through the port 370 and provides a flow of cooling fluid 322 through the heat exchanger 357. The heat exchanger 357 transfers heat from the refrigerant to the cooling fluid 322 flowing through the heat exchanger 357. The cooling fluid 322 is then discharged out the port 371 back into the reservoir 320.

In the illustrative embodiment, the cooling loop 330 may further include a pre-heater 353 as suggested in FIG. 4. The pre-heater 353 is configured to heat the refrigerant before it flows to the heat load 312 through the inlet conduit 369. The pre-heater 353 heats the refrigerant the target supply temperature at or just below its saturation temperature so that the refrigerant is a saturated liquid before flows to the heat load 12. An orifice at the inlet of the heat load 312, controls the pressure of the refrigerant before it flows to the heat load 312. The heat load 12 transfers heat to the refrigerant, which causes the refrigerant to boil. The refrigerant then flows out through the outlet conduit 366 and the BPR 355 controls the pressure of the refrigerant in the outlet conduit 366, before it flows to the heat exchanger 357 to be cooled.

The control unit 332 is coupled to the fluid pump 352 and the BPR 355 in the illustrative embodiment to control cooling of the heat load 312. Similarly, the control unit 332 is coupled to the compressor 344 and the expansion valve 348 to control the cooling of the cooling fluid 322 in the reservoir 320. By decoupling the different loops 328, 330, the control unit 332 may control the cooling of the cooling fluid 322 in the reservoir 320 separate from the cooling of the heat load 12.

For instance, the control unit 332 is configured to direct the heat rejection loop 328 to cool the cooling fluid 322 to a temperature based on the bulk temperature of the cooling fluid 322 in the thermal energy storage reservoir 320. Depending on the bulk temperature of the cooling fluid 322 in the thermal energy storage reservoir 320, the control unit 332 may reduce or even stop cooling the cooling fluid 322 in the reservoir 320, while maintaining the cooling of the heat load 312. Similarly, if the high-energy beam unit 312 is not being used, the control unit 332 may direct the pump 352 to reduce the flow rate of refrigerant, while the heat rejection loop 328 continues to cool the cooling fluid in the reservoir 320.

In the illustrative embodiment, the power electronics 326 are submerged in the cooling fluid 322. The heat exchanger 342 and expansion valve 348 included in the heat rejection loop 328 are also submerged in the cooling fluid 322. The fluid pumps 352, 354, the BPR 355, and the heat exchanger 357 included in the coolant loop 330 are submerged in the cooling fluid 322, as well as the control unit 332. In the illustrative embodiment, the pre-heater 353 may be located outside of the reservoir 320 to avoid adding additional heat to the reservoir 320.

The present disclosure relates to developing power and thermal management systems for directed energy weapons. Such power and thermal management systems present design challenges due to the (i) large and intermittent electrical and thermal load, (ii) austere environments which may include sand, dust, rain, hail, ice, etc., and (iii) potential exposure to enemy fire 11 such as bullets, shrapnel from IEDs, etc. As a result, ruggedizing such systems and their associated power and thermal management systems (PTMs) to meet the environmental and survivability may be beneficial.

In some embodiments, the large and intermittent thermal load is managed through the use of thermal energy storage, via a phase change material or sensible heat based solution. While a sensible heat based thermal energy storage solution is relatively easy to implement, model and control, the downside is that it requires a significant volume of fluid that may be difficult to package.

The power and thermal management system 14, 214, 314 of the present disclosure therefore includes a thermal energy storage reservoir 20, 220, 320 that is configured to manage the thermal load and protects the components of the system from the harsh environmental conditions. The reservoir 20, 220, 320 encases the components of the power and thermal management system 14, 214, 314 in the cooling fluid 22, 222, 322, which seals the components from sand, dust, etc., and also protects the components of the system 14, 214, 314 from ballistic impacts.

The cooling fluid 22, 222, 322 may be water, a glycol-water mixture, a dielectric fluid such as FC-72 or HFE7100, or other similar fluid. The design of the system 10 is the sensible thermal energy storage reservoir 20 may not need to be pressurized to function properly. This allows the enclosing box of the reservoir 20, 220, 320 to be more regularly shaped as opposed to a pressure vessel type shape in which it is difficult to mount components. The invention may also work with a pressurized reservoir.

The thermal energy storage reservoir 20, 220, 320 provides a reduction in size and space of the power and thermal management system 14, 214, 314 since every nook and cranny of volume allocated to the power and thermal management system 14, 214, 314 is serving a function of storing energy. In some embodiments, the thermal energy storage reservoir 20, 220, 320 may be able to store three times the required cooling fluid 22, 222, 322 compared to a separate reservoir. This obviously saves system volume, but may also enable either a more efficient system for equivalent energy storage by (i) allowing an increased cooling fluid temperature or (ii) for storing more energy within the reservoir when the cooling fluid temperature is maintained. Thus, either a smaller vapor cycle heat rejection system or a longer duration of heat dissipation may be allowed.

The cooling fluid 22, 222, 322 in the thermal energy storage reservoir 20, 220, 320 may also serve as means for providing ballistic protection. Bullets often disintegrate upon hitting the surface of water, which would protect the components submerged in the cooling fluid 22, 222, 322. This may of course lead to draining of the cooling fluid 22, 222, 322 upon enemy fire 11. However, this may be resolved by encasing the outer portion of power and thermal management system 14, 214, 314 and/or the thermal energy storage reservoir 20, 220, 320 with the same type of coating that is applied to military fuel tanks that self-seals after ballistic damage.

Alternatively, if the thermal energy storage reservoir 20, 220, 320 is drained, it may take the system 10, 2010, 310 off-line for a while. However, the reservoir 20, 220, 320 may be easily repaired via battlefield patching and re-filling as opposed to a system that is permanently damaged due to the ballistic damage.

In some embodiments, if the cooling fluid 22, 222, 322 is a dielectric fluid, then the thermal energy storage reservoir 20, 220, 320 may also be used to cool other components of the power and thermal management system 14, 214, 314 without having to route specific cooling lines to and from each of the components, which saves weight. Similarly, if the cooling fluid 22, 222, 322 is a dielectric fluid, then the enclosures of various electronic devices may also be removed further saving weight.

Another challenge in electronics design may be the avoidance and mitigation of condensation on the electronic circuits. Condensation occurs when the electronic component (s) sits in the ambient environment and cold coolant is delivered to the cold plates. Water may then condense out of the air onto the cold plate, which may possibly damage the electronic component(s). By completely enclosing the electronic component(s) in a dielectric-fluid there may be no exposure to air and therefore no risk of condensation on the component(s).

The other advantage of the power and thermal management system 14, 214, 314 is that the exact operating temperature range of the components within the system 10, 210, 310 may be known. For conventional systems, the operating temperature envelope of the system is often subject to a large degree of uncertainty due to the effects of solar loading and unknown convective heat transfer characteristics.

In some embodiments, the power and thermal management system 14, 214, 314 may include a 'stirrer' to keep the fluid moving throughout the entire power and thermal management system 14, 214, 314. In other embodiments, inlet/outlet ports 70, 72, 74, 370, 371, 372, 374 may be setup to provide a flow distribution that encourages mixing and avoids dead-zones.

For a sub-ambient thermal management system, the air-condenser/gas cooler 46, 246, 346 may be located outside of the power and thermal management system 14, 214, 314 via sealed pipework. If the power and thermal management system 14, 214, 314 is a water cooled system, then the heat exchanger 46, 246, 346 may be located within the power and thermal management system 14, 214, 314 with pipework going to and from the water source. For maintenance, the fluid will have to be drained and re-filled. The outside of the power and thermal management system 14, 214, 314 may be encased in an insulator to preserve efficiency.

As mentioned with the condenser/gas cooler 46, 246, 346, some components of the power and thermal management system 14, 214, 314 may be located outside of the fluid filled power and thermal management system 14, 214, 314. Another example would be a gas turbine engine 16, 216, 316 if the system 10, 210, 310 included one.

In the illustrative embodiment of FIG. 2, the power and thermal management system 14 includes a generator 24, which is coupled to the engine 16 outside of the system 14. In the illustrative embodiment of FIG. 3, the generator 224 and the engine 216 are part of the system 210, but not a part of the power and thermal management system 214. In such embodiments, the power and thermal management system 214 may be connected to any suitable power source. In the illustrative embodiment of FIG. 4, the engine 316 and the generator 324 are both included in the power and thermal management system 314 to provide power for the power electronics 326.

Additionally, the performance of the batteries 34 in particular may be heavily dependent on temperature. If the batteries 34 are too cold, the performance of the batteries 34 may be heavily degraded. Depending on the system 14, 214, 314, the batteries 34 may need to be located in the portion that is outside of the fluid-filled portion.

Similarly, the compressor 44, 244, 344, which may contain hot discharge gas, may be more ideally placed outside of the liquid volume. Otherwise, the compressor 44, 244, 344 may be adding heat to the thermal energy storage reservoir 20, 220, 320.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A weapons system comprising
  a high-energy beam unit configured to discharge high-energy beams, and
  a power and thermal management system configured to supply power to the high-energy beam unit and to manage the temperature of the high-energy beam unit, the power and thermal management system including a generator configured to generate electrical energy, power electronics coupled to the generator and configured to receive electrical energy from the generator and provide the electrical energy to other components of the system, and a thermal energy storage reservoir configured to store a cooling fluid,
  wherein at least some components of the power and thermal management system are submerged in the cooling fluid of the thermal energy storage reservoir to cool the components, to store energy, and to provide ballistics protection, and
  wherein the thermal energy storage reservoir has a coating configured to self-seal the hole after ballistic damage.

2. The system of claim 1, wherein the at least some components of the power and thermal management system submerged in the cooling fluid includes the power electronics.

3. The system of claim 2, wherein the power and thermal management system further includes at least one energy store device coupled to the power electronics to store electrical energy from the generator.

4. The system of claim 3, wherein the at least one energy store device is located outside of the thermal energy storage reservoir.

5. The system of claim 3, wherein the power and thermal management system further includes a heat rejection loop configured to transfer heat stored in the cooling fluid of the thermal energy storage reservoir to a surrounding environment.

6. The system of claim 5, wherein the heat rejection loop includes a heat exchanger in thermal communication with the cooling fluid to transfer heat from the cooling fluid to a refrigerant of the heat rejection loop, a compressor fluidly coupled to the heat exchanger, an ambient heat exchanger in thermal communication with the surrounding environment to transfer heat from the refrigerant to the surrounding environment, and an expansion valve.

7. The system of claim 6, wherein the at least some components of the power and thermal management system submerged in the cooling fluid includes the heat exchanger and the expansion valve.

8. The system of claim 5, wherein the power and thermal management system further includes a coolant loop in thermal communication with the high-energy beam unit to transfer heat from the high-energy beam unit to the cooling fluid to cool the high-energy beam unit, and wherein the at least some components of the power and thermal management system submerged in the cooling fluid includes the coolant loop.

9. The system of claim 1, wherein power and thermal management system further includes a stirrer configured to circulate the cooling fluid in the thermal energy storage reservoir to avoid temperature dead-zones.

10. The system of claim 1, wherein the cooling fluid is one of water, glycol-water mixture, and a dielectric fluid.

11. The system of claim 1, further comprising an engine configured to provide power for the high-energy beam unit.

12. A system comprising
a heat load, and
a power and thermal management system configured to manage the temperature of the heat load, the power and thermal management system including a generator configured to generate electrical energy, power electronics coupled to the generator and configured to receive electrical energy from the generator and provide the electrical energy to other components of the system, and a thermal energy storage reservoir configured to store a cooling fluid,
wherein at least some components of the power and thermal management system are submerged in the cooling fluid of the thermal energy storage reservoir to cool the components, to store energy, and to provide ballistics protection, and
wherein the power and thermal management system further includes a heat rejection loop configured to transfer heat stored in cooling fluid of the thermal energy storage reservoir to a surrounding environment, and wherein the at least some components of the power and thermal management system submerged in the cooling fluid includes components of the heat rejection loop.

13. The system of claim 12, wherein the at least some components of the power and thermal management system submerged in the cooling fluid includes the power electronics.

14. The system of claim 12, wherein the power and thermal management system further includes at least one energy store device coupled to the power electronics to store electrical energy from the generator.

15. The system of claim 14, wherein the at least one energy store device is located outside of the thermal energy storage reservoir.

16. A system comprising
a heat load, and
a power and thermal management system configured to manage the temperature of the heat load, the power and thermal management system including a generator configured to generate electrical energy, power electronics coupled to the generator and configured to receive electrical energy from the generator and provide the electrical energy to other components of the system, and a thermal energy storage reservoir configured to store a cooling fluid,
wherein at least some components of the power and thermal management system are submerged in the cooling fluid of the thermal energy storage reservoir to cool the components, to store energy, and to provide ballistics protection, and
wherein the power and thermal management system further includes a coolant loop in thermal communication with the heat load to transfer heat from the heat load to the cooling fluid to cool the heat load, and wherein the at least some components of the power and thermal management system submerged in the cooling fluid includes the coolant loop.

17. The system of claim 12, wherein the cooling fluid is one of water, glycol-water mixture, and a dielectric fluid.

18. The system of claim 12, wherein the thermal energy storage reservoir has a coating configured to self-seal the hole after ballistic damage.

19. The system of claim 12, wherein the power and thermal management system further includes a coolant loop in thermal communication with the heat load to transfer heat from the heat load to the cooling fluid to cool the heat load, and wherein the at least some components of the power and thermal management system submerged in the cooling fluid includes the coolant loop.

20. The system of claim 16, wherein the thermal energy storage reservoir has a coating configured to self-seal the hole after ballistic damage.

* * * * *